United States Patent
Rohde et al.

(10) Patent No.: US 7,612,296 B2
(45) Date of Patent: Nov. 3, 2009

(54) VISUALLY INSPECTABLE SURFACE MOUNT DEVICE PAD

(75) Inventors: Meta Rohde, Upper Saddle River, NJ (US); Ajay Kumar Poddar, Elmwood Park, NJ (US); Klaus Juergen Schoepf, Ringwood, NJ (US); Reimund Rebel, Ringwood, NJ (US)

(73) Assignee: Synergy Microwave Corporation, Paterson, NJ (US)

( * ) Notice: Subject to any disclaimer, the term of this patent is extended or adjusted under 35 U.S.C. 154(b) by 0 days.

(21) Appl. No.: 11/216,813

(22) Filed: Aug. 31, 2005

(65) Prior Publication Data
US 2006/0042831 A1    Mar. 2, 2006

Related U.S. Application Data

(60) Provisional application No. 60/605,791, filed on Aug. 31, 2004.

(51) Int. Cl.
*H01R 12/04* (2006.01)
*H05K 1/00* (2006.01)

(52) U.S. Cl. .......................................... 174/262; 29/852

(58) Field of Classification Search ................. 361/749, 361/751, 767–771, 792–795; 439/55, 67; 174/262–266; 29/852
See application file for complete search history.

(56) References Cited

U.S. PATENT DOCUMENTS

| | | | | |
|---|---|---|---|---|
| 5,744,869 A * | 4/1998 | Root | ........................... | 257/778 |
| 5,838,549 A | 11/1998 | Nagata et al. | | |
| 6,346,679 B1 * | 2/2002 | Nakamura | ................... | 174/260 |
| 6,404,206 B1 * | 6/2002 | Sperschneider | ............. | 324/537 |
| 6,525,623 B2 | 2/2003 | Sridharan et al. | | |
| 6,917,265 B2 | 11/2004 | Almeida et al. | | |
| 7,012,569 B2 * | 3/2006 | Gottwald et al. | ...... | 343/700 MS |
| 7,155,815 B2 * | 1/2007 | Gernhardt et al. | ............. | 29/825 |
| 2003/0029907 A1 * | 2/2003 | Neidich et al. | ......... | 228/180.22 |
| 2003/0151485 A1 | 8/2003 | Lewis | | |
| 2004/0022934 A1 | 2/2004 | Leung et al. | | |
| 2004/0113840 A1 * | 6/2004 | Gottwald et al. | ...... | 343/700 MS |
| 2004/0233024 A1 * | 11/2004 | Almeida et al. | ............. | 333/246 |
| 2005/0179729 A1 * | 8/2005 | Keenan | ....................... | 347/50 |

FOREIGN PATENT DOCUMENTS

| | | |
|---|---|---|
| JP | 2000-299536 A | 10/2000 |
| JP | 2001-015881 A | 5/2001 |
| WO | WO-02/23963 A | 3/2002 |

OTHER PUBLICATIONS

Intel, "Introduction," 1999 Packaging Databook, pp. 1-1 through 1-12.
Intel, "Leaded Surface Mount Technology", 2000 Packaging Databook, pp. 7-1 through 7-14.
Simon Mason, TWI World Centre For Materials Joining Technology,"Surface Mount Technology," 2001 pp. 1-2.
Vern Solberg, Penwell Corp. Surface Mount Technology (SMT) Surface Mount Design Feb. 2003 pp. 1-3.

* cited by examiner

*Primary Examiner*—Jeremy C Norris
(74) *Attorney, Agent, or Firm*—Lerner, David, Littenberg, Krumholz & Mentlik, LLP (57) ABSTRACT

A printed circuit board having one or more vias disposed in the surface area of a pad. The pad may serve as a connection point between the printed circuit board and another circuit board and is disposed along the edge of the board such that the vias do not form half vias.

13 Claims, 4 Drawing Sheets

VISUALLY INSPECTABLE SURFACE MOUNT DEVICE PAD

CROSS-REFERENCE TO RELATED APPLICATIONS

The present application claims the benefit of the filing date of U.S. Provisional Application No. 60/605,791, filed Aug. 31, 2004, the disclosure of which is hereby incorporated herein by reference.

BACKGROUND

The present invention relates to surface mount technology or design and, more particularly, to systems and methods for assembly of printed circuit boards (PCBs) that employ surface mount technology.

A printed circuit board (PCB) or printed wiring board (PWB) is a composite of materials that provides a surface or substrate on which electronic components or modules may be mounted. PCBs are included in almost all electronic devices including, for example, cellular telephones, television sets, calculators, personal computers, personal digital assistants, telecommunication switches, cameras, etc. The PCB usually provides mechanical support and allows for electrical interconnection among the electronic components or modules.

In general, a PCB typically consists of etched conductors attached to a sheet of insulator. The insulator is generally referred to as the substrate. The substrate is typically made of epoxy-glass-based laminates. The thickness of the laminates may range from less than 0.1 millimeter (mm) to several millimeters. The etched conductors are called traces or tracks. These tracks usually provide electrical interconnections and traverse the outer surface of the board, but may also be formed as inner layers inside the substrate of the substrate of the multilayer board. The electronic components or modules may be mounted on a single side of a board, as well both sides of the board and are typically connected to the conductive tracks by soldering.

The conductive tracks or patterns may be formed by one or more layers of conductors that are interconnected by either through, blind or buried holes or vias, separated by an insulating material, such as epoxy-glass. The conductive pattern typically includes circuit pads (generally referred to as pads throughout) or lands that are used for the connection of the components or modules to the board. A pad may contain a hole or a via. Vias, however, are not usually intended to serve as receptacles for component leads, but instead are generally used as electrical interconnect points or serve to thermally join different conductive layers of a multi-layer structure. The components are usually soldered to the board at the pads either by manual soldering or, more typically, automated soldering, e.g., solder reflow, in a surface mount technology (SMT) or surface mount design (SMD).

SMD typically allows production of more reliable assemblies with higher input/output, increased board density, and reduced weight, volume, and cost. In SMD, the components are assembled or affixed onto the surface of the board without the insertion of the component or module leads into the holes or vias on the board. The components are usually held in place by a sticky mixture of flux. Tiny solder particles are usually applied to the solder pads on the board. The board is conveyed through a oven where the solder paste melts and bonds the components to board and the tracks.

SMD has replaced, to a large extent, conventional through-hole technology, in which the components had leads that passed through holes in the board and which were soldered on the opposite side of the board. As discussed above, in SMD, vias typically serve as interconnection points between the electronic components and the conductive tracks and are usually produced with a small diameter. When a via is formed at the edge of the substrate it typically comprises a semi-circular hole that is called a half via. Half vias are usually formed on most boards during the manufacture. For example, smaller printed circuit boards are usually made from bigger panels by separating the panels using a high speed router, e.g., operating at 50,000 r.p.m., or via a laser cutting operation. After separating the larger panel, half vias are typically formed from the bottom to the top around the edge of the substrate or carrier material and include a metal layer of material (metallization), e.g., gold plated, to form a metallized pad.

Half vias are generally considered problematic. For one, half vias are not as mechanically stable as an undisturbed through via. Furthermore, it is usually challenging to reliably make an electrical connection between a half via in a pad on a module and, for example, a board or substrate on which the module may be mounted. A typical solution to this problem is commonly referred to as plating. In plating, the surface area immediately around a via or hole on the substrate is coated with a metal, which is typically electrolytically or chemically deposited from a bath. Even where plating is employed it is still often difficult to tell whether a solder connection at a half via will provide sufficient electrical connectivity.

Of utility then are processes and systems that will improve the mechanical stability and electrical connectivity between components mounted on a board as part of a SMD.

SUMMARY

An aspect of the present invention is a substrate. The substrate preferably comprises a substantially planar surface having an edge and a pad formed along the edge of the planar surface. The pad preferably extends over a portion of the planar surface and includes at least one via extending through the substrate. In accordance with this aspect of the present invention, the via desirably provides a connection point to the substrate. Most preferably, the connection point comprises an inter-board connection point for electrical signals.

In accordance with this aspect of the present invention, the at least one via desirably includes a surface area that is coated with a layer of metallic material. The metallic material is preferably selected from the group consisting of gold and silver. Most preferably, the gold comprises electroless nickel immersion gold (ENIG).

Further in accordance with this aspect of the present invention, the substrate is a composite selected from the group consisting of inorganic materials and organic materials.

In addition, the substrate forms a portion of printed circuit board selected from the group consisting of polymer-based, ceramic-based, FR4-based and flexible dry film-based printed circuit boards.

Further in accordance with this aspect of the present invention, the shape of the at least one via may be selected from the group consisting of round, oval, slot, square and rectangular openings. The inner diameter of the full via may vary depending upon the operating frequency but not limited to the particular shape so long its contour forms closed loop.

Further still in accordance with this aspect of the present invention, the arrangement of the size and shape of the pad and the location of the at least one via may comprise a connection having a constant impedance transformation. Preferably, the constant impedance transformation comprises 50 or 75 Ohms, and can be easily extended to other impedance levels.

Alternatively, it may be desirable if the arrangement of the size and shape of the pad and the location of the at least one via comprises a connection having a non-constant impedance transformation. The non-constant impedance transformation may desirably comprise 50 or 75 Ohms.

In accordance with an additional aspect of the present invention, a printed circuit board is provided. The printed circuit board preferably comprises a pad disposed on an edge of the board, the pad having a via that forms a plated through hole entirely within the pad. Most preferably, the plated through hole is capable of forming an electrical interconnection point for the printed circuit board.

Further in accordance with this aspect of the present invention, the via is plated with a metallic material selected from the group consisting of gold and silver.

In addition, the pad may comprise a solder pad.

Further in accordance with this aspect of the present invention, the arrangement of the size and shape of the pad and the location of the via comprises a connection having a constant impedance transformation. Alternatively, the arrangement of the size and shape of the pad and the location of the via comprises a connection having a non-constant impedance transformation.

In another aspect, the present invention is a process for making a printed circuit board. The process preferably comprises forming at least one conductive track on an insulator, and forming a pad along an edge of the insulator and at an end of the at least one conductive track such that a via formed in the pad is positioned within the pad and away from the edge of the insulator.

Further in accordance with this aspect of the present invention, forming the pad comprises positioning the pad along the conductive track, drilling a through hole in the pad to form the via, separating the insulator to form the edge such that the via is positioned within the pad and away from the edge.

Further in accordance with this aspect of the present invention, the process further comprises coating a surface area around the via with a metal.

In one aspect, the present invention comprises a pad having a via or hole preferably disposed in the pad. In an additional aspect, the present invention preferably comprises a pad having more than one via or hole disposed in an area of the solder pad. Further in accordance with this aspect of the present invention, the pad is desirably disposed along an edge of the surface of a printed circuit or wire board formed from a composite of organic or inorganic materials including, for example, FR4, ceramic or flexible films. The via or holes may desirably comprise a round, oval, slot, square or rectangular shape.

Further still in accordance with this aspect of the present invention, the arrangement of the pad size, shape and location of the one or more vias or holes preferably form a connection having a constant impedance transformation. Most preferably, the constant impedance transformation comprises 50 or 75 Ohms, but may also include other impedance values. Alternatively, the arrangement of the pad size, shape and location of the one or more vias or holes preferably forms a connection having a non-constant impedance transformation. Most preferably, the non-constant impedance transformation comprises 50 to 75 Ohms or 75 to 50 Ohms, but may also include other ranges of impedance values.

In accordance with an aspect of the present invention, a via or hole in a circuit or solder pad is moved from the edge of the pad to a position inside the pad. In accordance with this aspect of the present invention, the via advantageously forms a through hole inside the pad. Accordingly, the via is kept intact and maintains its mechanical strength when separating modules using a router or laser cutting.

Further in accordance with an additional aspect of the present invention, a substrate comprising a pad having at least one via disposed in the surface area of the pad is provided. Preferably the pad is disposed along an edge of the substrate. Further in accordance with this aspect of the present invention, the substrate preferably comprises a composite of organic or inorganic materials. The substrate preferably forms a portion of a polymer-base, ceramic-base, or FR4-base printed circuit board. Additionally, the substrate may desirably form a portion of a flexible dry film-base printed circuit board. Further still, the at least one via is of the shape selected from the group consisting of round, oval, slot, square, and rectangular shapes. The arrangement of the size and shape of the pad and the location of the via most desirably comprises a connection having a constant impedance transformation. Alternatively, the arrangement of the size and shape of the pad and the location of the via may also desirably comprise a connection having a non-constant impedance transformation.

In accordance with an additional aspect of the present invention, a visual inspection can provide information about the quality of the solder connection. In addition, multiple through connections may be placed inside the pad to accommodate different design parameters and to improve the mechanical performance, the electrical performance and the quality of the inspection.

DETAILED DESCRIPTION

Figure 1:
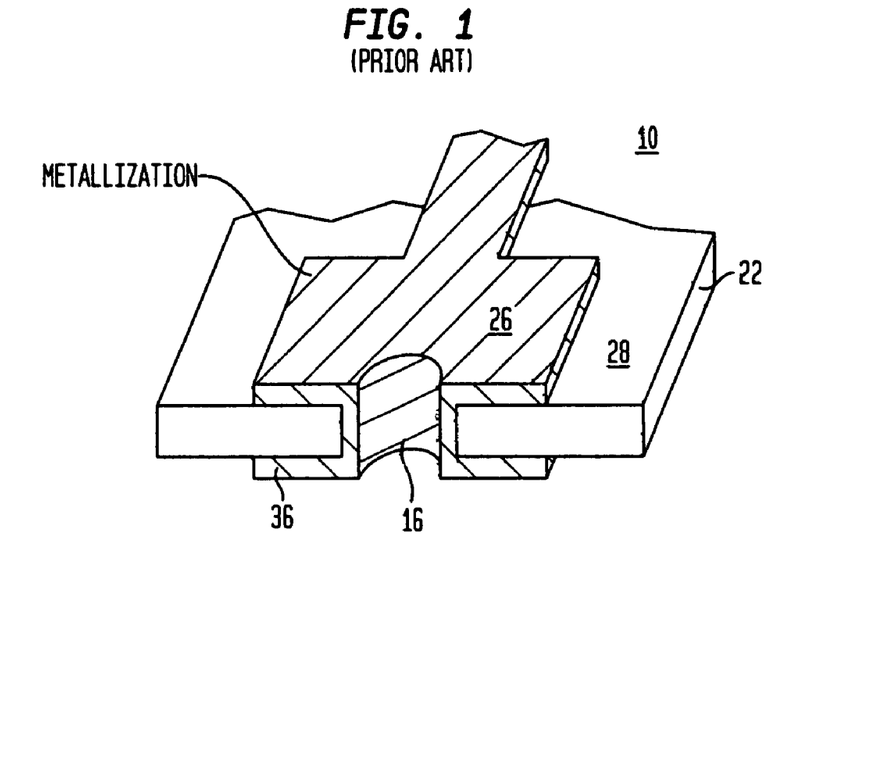
FIG. 1 shows a prior art half via formed at the edge of a carrier substrate.

FIG. 1 illustrates a prior art board 10 having a plated half via 16 formed along an edge of a substrate or insulator 22. As is discussed above, the half-via may be formed as a result of separating different modules formed on a substrate. A pad 26 is also formed on an upper surface 28 of the substrate 22. As shown, the half via 16 and pad 26 have been coated with a metal, i.e., undergone metallization, as part of a plating process. The metallization within the half via 16 extends to another pad 36 formed on the bottom surface of the substrate 22. Although, the metallized half via 16 provides electrical connectivity between the upper and lower surfaces of the substrate 22, it generally does not provide a stable mechanical connection if is used, for example, to mount a module on the substrate 22 to the mounting board.

Figure 2A:
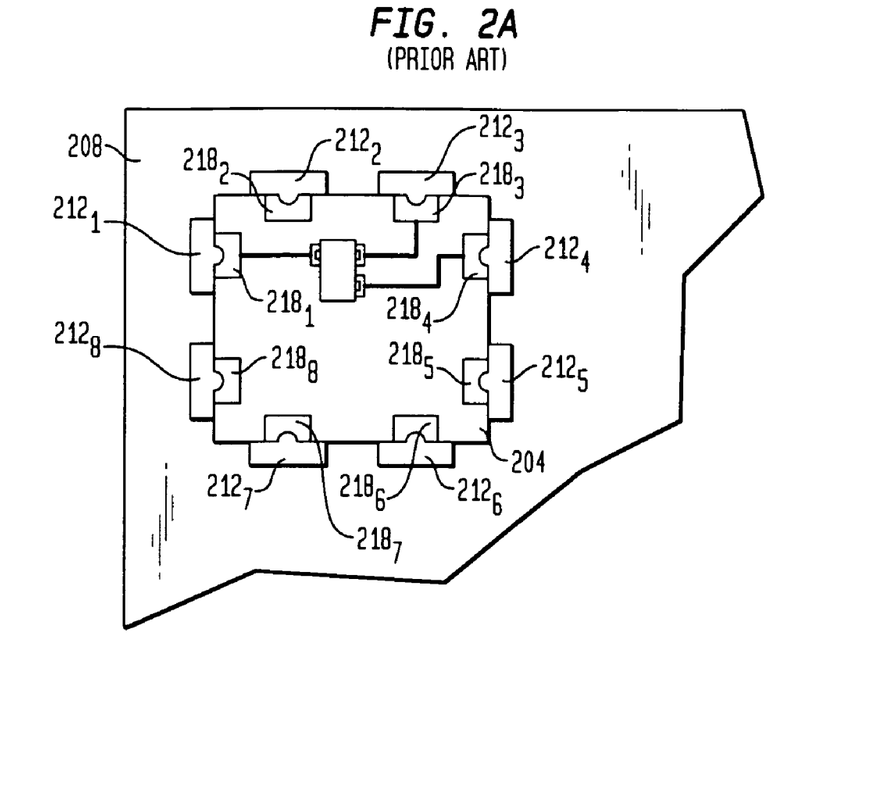
FIG. 2A illustrates a prior art method of attaching a module to a main board using half vias.

In particular, FIG. 2A is an exploded view of a partial schematic showing an example of a module 204 mounted on a main or mounting board 208. The mounting board 208 includes solder pads 212 that serve as connection points for respective half vias 218. The half vias 218 are formed along the outer edge of the module 204 and may be soldered to the main board 208 by heating the solder pads 212 during manufacturing as part of a solder reflow process.

Figure 2B:
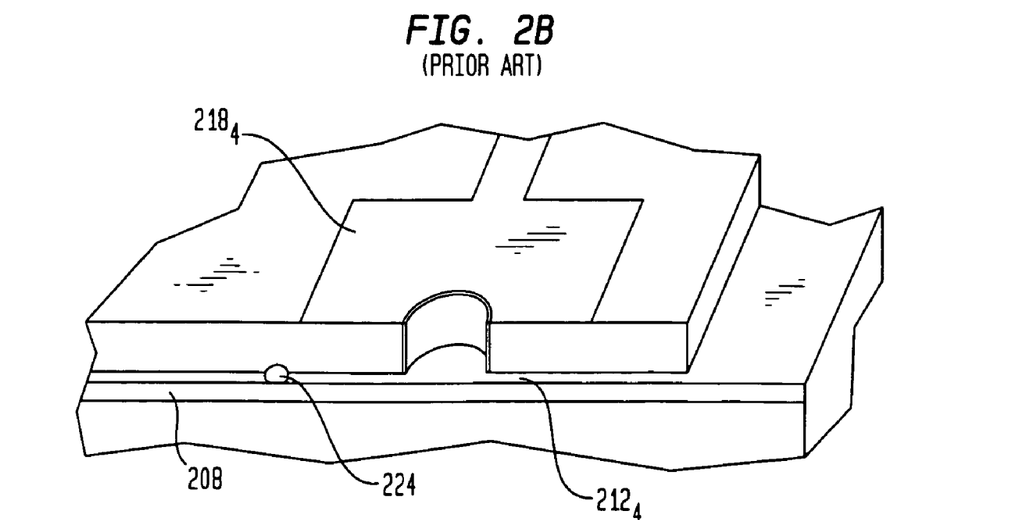
FIG. 2B is an exploded view along an edge of the module and main board of FIG. 2A.

When soldering a half via, as is shown in more detail in FIG. 2B, solder will typically collect on the corner between the module or component and the mounting board 208 forming a bead 224. The bead 224 typically makes it difficult to visually inspect the solder flow underneath the solder pad. In addition, the quality of the electrical connectivity of the solder connection cannot be checked, since the metallization on the edge typically builds a good electrical connection.

Independent from the electrical parameters, a connection without solder flowing underneath the solder pad causes mechanical instability between the solder connection and the edge plating. In particular, if mechanical tension is caused by a temperature change or vibration, the mechanical stress to the metallization around the edge typically causes the connection to break. Even if hand soldered, which leads to a larger solder bead on the corner, the connection has a tendency to break above the solder bead. In addition, in the case where lead free solder is used, the quality of the solder connection becomes an issue because of the different characteristics of the lead free solder.

Figure 3:
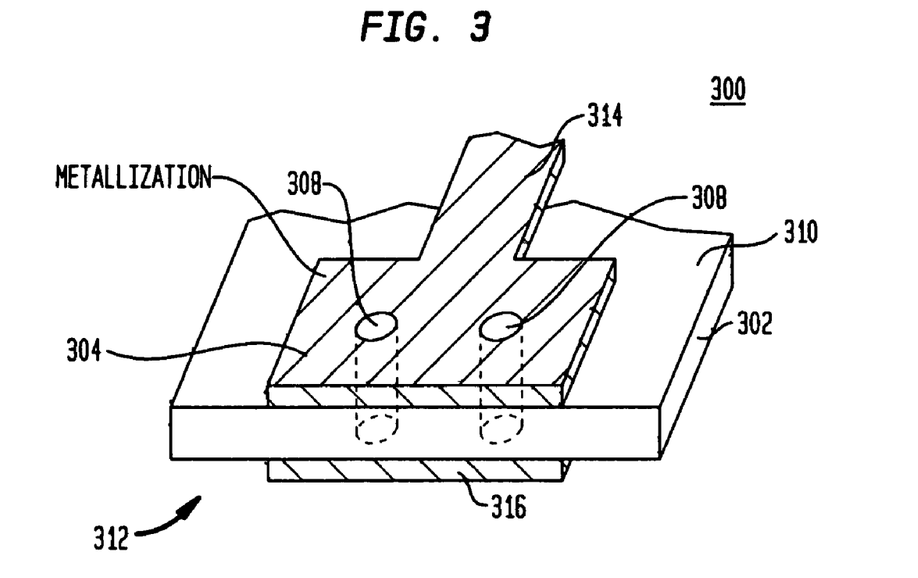
FIG. 3 shows a through hole or via formed at the edge of a substrate in accordance with an aspect of the present invention.

As shown in FIG. 3, in an aspect of the present invention one or more vias or holes are formed within a pad on a substrate or insulator that comprises a portion of a printed circuit board 300. In particular, the board 300 includes a substrate 302. The substrate 302 may be formed from a composite of organic or inorganic materials including, for example, FR4, Roger, ceramic or flexible films. A pad 304 is formed on a upper surface 306 of the substrate. In the particular embodiment shown, a pair of plated through holes or vias 308 are formed within the pad 304. The through holes 308 extend from the upper surface 306 through to a lower surface 312 on the substrate 302. The through holes 308 are shown as interconnecting a pad 316 on the lower surface 312. The pad 304 also terminates a portion of the trace or track 314. The through holes 308 are formed at a relatively short distance away from the edge of the substrate within the metallization or pad 304 that is used to form a circuit connection point as well as a physical connection point between the substrate and another printed circuit board. Although circular through holes 308 are shown, the via or holes may be of a oval, slot, square or rectangular shape. In addition, although two through holes or vias are shown, one or a plurality of vias may be used.

The through holes or vias 308 provide a reliable and convenient means for inspecting solder flow beneath the pad 304. In particular, in the case of manual soldering, the solder flows from the side underneath the pad. Visual inspection may then be performed by looking through one of the holes 308, which will provide an indication of when the solder reached the hole and acts like a quality indicator. In addition, where hand soldering will be used, the pad size may be extended 20 mils (0.5 mm) along the edge of the substrate making it easier for inexperienced operators to carry out soldering.

In case of an SMD assembly using solder paste, the excessive solder will typically be sucked into the holes so that the distribution of solder underneath the pads is more even than with solder pads of the prior art. The additional thickness of the solder layer underneath the pad provides for a better connection and mechanical strength. Special gold plating of the vias, using, for example, electroless nickel immersion gold (ENIG) or silver plating, supports the removal of excessive solder particularly where lead free solder is used, given the different characteristics of the lead free solder. Lead free solder, such as SN96, can be used to make safer and more reliable contacts.

In addition, a small bead of solder will typically form inside the hole and will lead to better mechanical performance of the connection. The undisturbed plated via held in place by the solder bead is better able to handle forces in all directions as opposed to the half via of the prior art. This advantageously improves protection against vibration and/or thermal expansion. Moreover, as no copper or other metal will usually be exposed along the edge of the board, long term reliability should increase by reducing the likelihood that oxidation and corrosion will occur.

Figure 4:
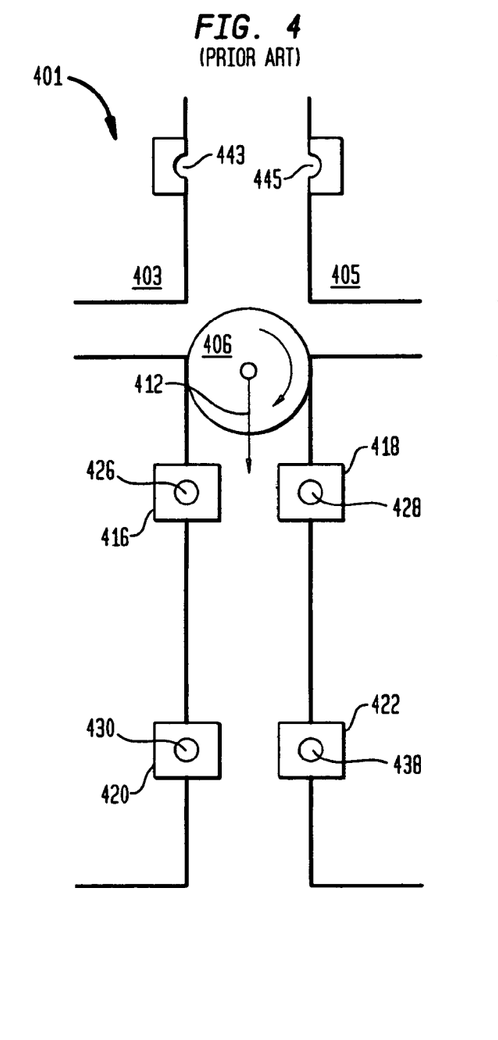
FIG. 4 shows a prior art method of forming half vias along the edge of a substrate.

Turning now to FIG. 4, there is shown a typical prior art process for separating a larger panel 401 into one or more printed circuit boards 403, 405. As shown, the printed circuit boards 403, 405 have been cut by a router 406 translating along the larger panel 401 along the direction denoted by arrow 412. A plurality of pads 416, 418, 420 and 422 are formed on the un-cut portion of the panel 401. Through holes or full vias, 426, 428, 430, 438 extend through the center of each of the pads before separation. As the router 406 translates in the direction 412, each of the full vias 426, 428, 430, 438 are cut so as to form half vias, such as half vias 443, 445 (see also FIG. 1). As discussed above, half vias do not perform as well as through holes and full vias.

Figure 5:
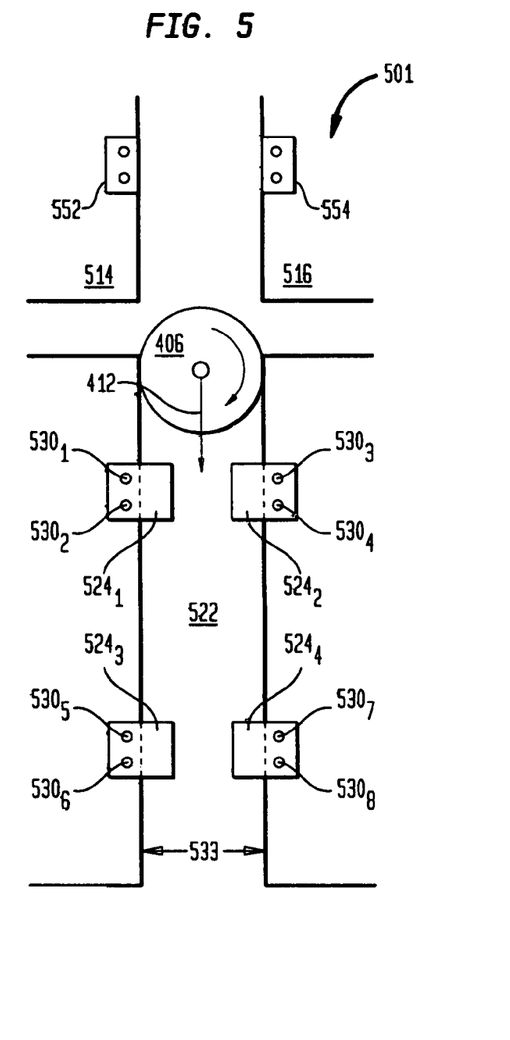
FIG. 5 shows a method of forming a through hole or via along the edge of a substrate.

Turning now to FIG. 5, there is shown a process for forming a printed circuit board in accordance with an aspect of the present invention. In addition to printed circuit boards 514, 516, the larger panel 501 includes a un-cut or un-separated portion 522. The un-cut portion 522 includes a plurality of pads 524. Each pad includes a pair of through holes 530 formed within a region of the pad. As shown, the through holes 530 are located on the inner half of the pad 524 away from the portion of the pad that extends into the cutting surface 533. As a result, as the router 406 translates 412 along the cutting surface 533, the through holes 530 remain intact.

As shown in FIG. 5, if the vias are not formed at the center of the pads but moved within the surface area of the pads 530, for example, half vias are eliminated as shown in pads 552 and 554. Thus, in accordance with this aspect of the present invention, during the design of the board half vias may be eliminated. Accordingly, during the later phases of the manufacturing process the modules or boards that are formed may be mounted onto the substrate using vias, which allow for easier visual inspection and provides for better electrical and mechanical connection. Note also that although in the foregoing description a router is used to separate the panel into printed circuit boards, a laser may also be used to separate the panel.

Figure 6:
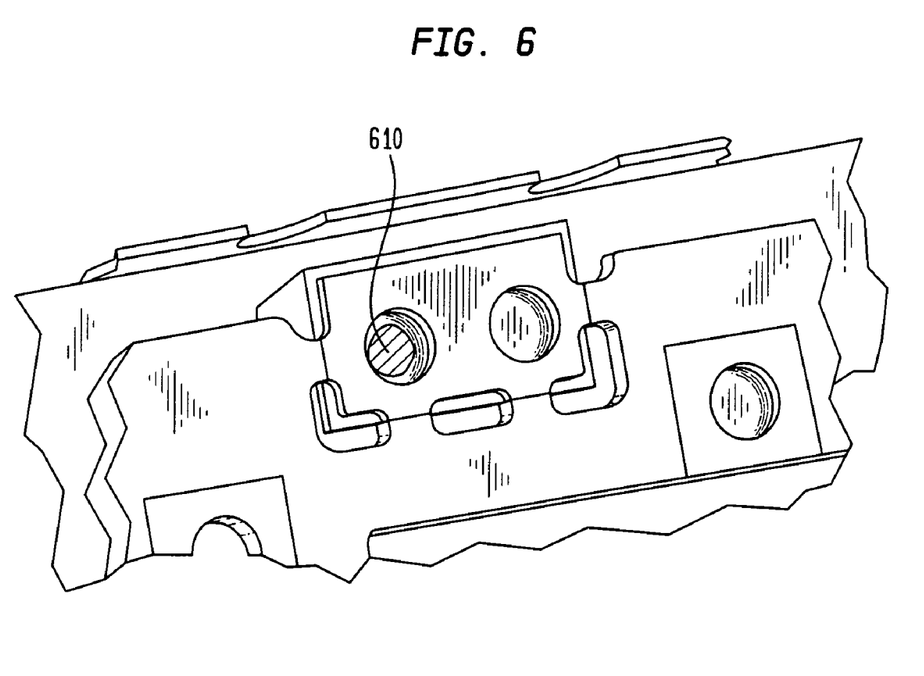
FIG. 6 illustrates a pair of through holes or vias formed along an edge of a board in accordance with an aspect of the present invention.
Figure 7:
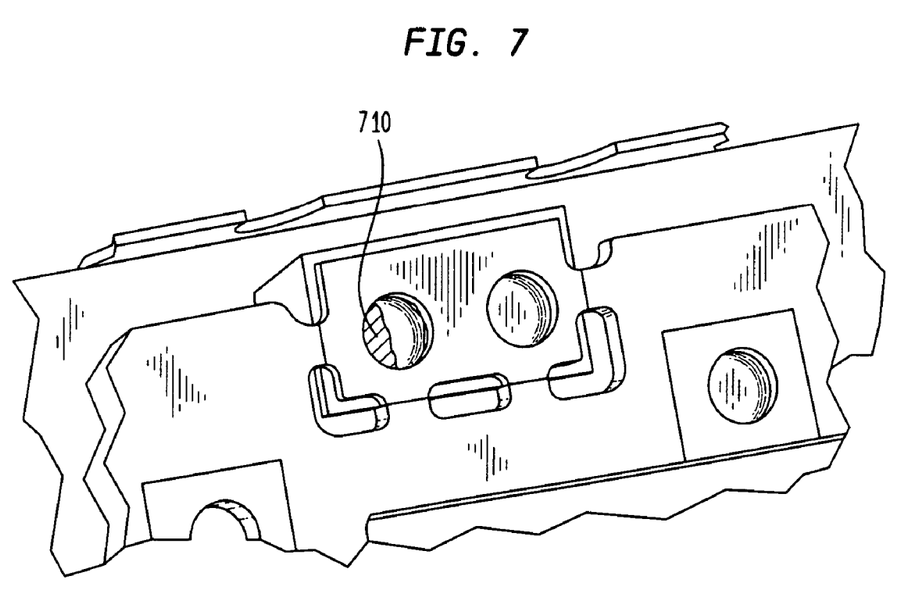
FIG. 7 illustrates a pair of through holes or vias formed along an edge of a board in accordance with an aspect of the present invention.

With regard to visual inspection, we have found that where manual soldering is employed, the solder usually penetrates and extends in the hole, as best seen in FIG. 6 for example. In FIG. 6, the solder provides a shoulder 610 that is visible, even at an angle as shown. FIG. 7, on the other hand, shows a solder joint 710 having a visible misalignment. Where solder paste (manual of machine) is used, the amount of solder does not usually extend into or climb up the hole. However, where solder paste is used, visual inspection may be based on the size of a solder shoulder formed in a hole, such as hole 308.

In the process described in FIG. 5, prior to separating the panels into PCBs, the layout of the board is often designed using known processes that usually include simulation or CAD software. Once the layout is designed, the process moves to the step of forming the conductive tracks on the insulator or substrate. The conductive tracks may be formed on the substrate using any known method. For example, a layer of metal may be adhered to the entire surface of the substrate. The unwanted metal may then be removed using chemical etching leaving only the desired layout or tracks. The tracks may, however, be added to the substrate by other methods such as multiple electroplating.

Once the tracks are laid out on the substrate, through holes may then be drilled at desired locations along the trace. The larger board may then be separated as discussed above.

In accordance with the foregoing description, the various aspects of the present invention may be suitably employed, for example, in the making of surface mountable devices that have previously been mounted to a printed circuit board using half vias. Such devices include for example, infrared emitters, microwave modules or circuits including voltage controlled oscillators, resonator oscillators, etc., or amplifiers.

In accordance with the foregoing aspects of the present invention the ability to remove or unsolder a component, as for example, during repair is improved. More specifically, when the metallization inside a half via is heated up during the unsolder process, the adhesion of the metal to the substrate suffers from the heat, which sometimes results in the half via being damaged. In accordance with this aspect of the present invention, since the metallization inside the via or hole does not rely on the adhesion to the substrate to form a mechanically stable connection, the probability of damage to the construction is lowered.

In accordance with a further aspect of the present invention, a method for preparing a printed circuit board or module is provided. The method preferably comprises forming one or more vias in the pads along the edge of a printed circuit board in the surface area of the pads. More specifically, during the design and manufacturing of a printed circuit board, the layout of the components or circuits are initially done, typically, using CAD software. As part of the design process routing of the conductive layers between components may be done automatically or interactively in accordance with layout rules. In accordance with this aspect of the present invention, a circuit designer may have the routing program create full vias (as shown for example in FIG. 3) within the region of the pad that will lie along the edge of the board. Accordingly, during the manufacturing process when the router or laser separates the panels into boards, half vias are eliminated.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A circuit board assembly, comprising:
   a first substrate having a planar surface and at least one solder pad disposed thereon; and
   a second substrate having a planar surface and a circuit pad disposed along an edge of the planar surface, the circuit pad having two separate vias arranged therethrough and fully disposed in the circuit pad,
   wherein the second substrate is mounted onto the planar surface of the first substrate with the circuit pad disposed above the solder pad such that the solder pad is arranged beneath the separate vias and viewable through the vias, and
   wherein the configuration of the size and shape of the circuit pad and the location of the via comprises a connection having a constant impedance transformation.

2. The circuit board assembly of claim 1, wherein the via forms a plated through hole, the via being arranged entirely within the circuit pad, the plated through hole configured to provide an electrical interconnection for connecting the first substrate with the second substrate.

3. The circuit board assembly of claim 2, wherein a solder bead is arranged around an entire circumference of the plated through hole at a connection interface with the circuit pad.

4. The circuit board assembly of claim 1, wherein the first and second substrates are selected from the group consisting of polymer-based, ceramic-based, FR4-based and flexible dry film-based printed circuit boards.

5. An interconnection product manufactured by the steps of:
   forming at least one conductive track on an insulator;
   forming a pad along an edge of the insulator and at an end of the at least one conductive track such that a via formed in the pad is are positioned within the pad and away from the edge of the insulator, wherein the configuration of the size and shape of the circuit pad and the location of the via comprises a connection having a constant impedance transformation; and
   soldering at least a portion of the via in the pad to a connection pad of a substrate.

6. The interconnection product according to claim 5, wherein:
   two separate vias formed in the pad are positioned within the pad and away from the edge of the insulator.

7. The interconnection product according to claim 5, further comprising:
   coating a surface area around the via with a metal.

8. An interconnection system, comprising:
   a mounting board including solder pads; and
   a circuit board having at least one edge, one or more circuit pads disposed along the at least one edge and at least two separate through holes disposed along the at least one edge, each through hole being disposed entirely within a circuit pad,
   the circuit board being arranged on the mounting board such that at least one circuit pad is located above a first solder pad with the through holes associated with the at least one circuit pad arranged to provide a passageway to the first solder pad,
   wherein the configuration of the size and shape of the circuit pad and the location of the via comprises a connection having a constant impedance transformation.

9. The interconnection system of claim 8, wherein each circuit pad and through hole is coated with a metal.

10. The interconnection system of claim 8, wherein the circuit board includes an upper surface and a lower surface, each circuit pad having a first portion disposed on upper surface and a second portion disposed on the lower surface such a through hole disposed within the circuit pad provides electrical connectivity between the upper surface and lower surface of the board.

11. The interconnection system of claim 10, further comprising an electrical component that is mounted onto the upper surface of the circuit board.

12. The interconnection system of claim 8, wherein the circuit board is formed from a composite selected from the group consisting of polymer-based, ceramic-based, FR4-based and flexible dry film-based printed circuit boards.

13. An interconnection system, comprising:
   a mounting board including solder pads; and a circuit board having at least one edge, one or more circuit pads disposed along the at least one edge and one or more through holes disposed along the at least one edge, each through hole being disposed entirely within a circuit pad, wherein the configuration of the size and shape of the circuit pad and the location of the via comprises a connection having a constant impedance transformation, and the circuit board being arranged on the mounting board such that at least one circuit pad is located above a first solder pad with the through hole associated with the at least one circuit pad arranged to provide a passageway to the first solder pad.

* * * * *

UNITED STATES PATENT AND TRADEMARK OFFICE
CERTIFICATE OF CORRECTION

| | | |
|---|---|---|
| PATENT NO. | : 7,612,296 B2 | Page 1 of 1 |
| APPLICATION NO. | : 11/216813 | |
| DATED | : November 3, 2009 | |
| INVENTOR(S) | : Meta Rohde et al. | |

It is certified that error appears in the above-identified patent and that said Letters Patent is hereby corrected as shown below:

Column 8, line 21, "pad is are positioned" should read -- pad is positioned --.

Signed and Sealed this
Eighteenth Day of January, 2011

David J. Kappos
*Director of the United States Patent and Trademark Office*